United States Patent
Planillo et al.

(10) Patent No.: US 9,825,195 B1
(45) Date of Patent: *Nov. 21, 2017

(54) PLANAR GRAPHENE SEMI-CYCLOTRONS

(71) Applicant: The United States of America as Represented by Secretary of the Navy, Washington, DC (US)

(72) Inventors: Jordan Rudolph Pagayanan Planillo, Camarillo, CA (US); Michael A. Torres, Newbury Park, CA (US); Christopher A. Foster, Oxnard, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/379,922

(22) Filed: Dec. 15, 2016

Related U.S. Application Data (62) Division of application No. 15/099,259, filed on Apr. 14, 2016, now Pat. No. 9,560,735.

(51) Int. Cl.
 *H05H 13/00* (2006.01)
 *H01L 31/14* (2006.01)
 *H01L 29/16* (2006.01)

(52) U.S. Cl.
 CPC .......... *H01L 31/14* (2013.01); *H01L 29/1606* (2013.01)

(58) Field of Classification Search
 CPC . H01L 31/14; H01L 29/1606; H01J 37/32082
 USPC ................... 313/62, 498, 506, 310
 See application file for complete search history.

(56) References Cited

U.S. PATENT DOCUMENTS 9,560,735 B1 * 1/2017 Planillo .................... H03B 1/00

* cited by examiner

*Primary Examiner* — Vip Patel
(74) *Attorney, Agent, or Firm* — James M. Saunders

(57) ABSTRACT

Various emitters and emitter systems are disclosed. For instance, in various embodiments, an emitter can comprise a substrate, an insulator bonded to the substrate, a graphene layer bonded to the insulator, and a first electrical contact and a second electrical contact. The first electrical contact can be bonded over a first portion of the graphene layer, and the second electrical contact can be bonded over a second portion of the graphene layer. The graphene layer electrically couples the first electrical contact and the second electrical contact and is configured to receive the application of a pulsed input voltage between the first electrical contact and the second electrical contact and to radiate radio frequency (RF) energy. An emitter system can comprise a plurality of emitters, each disposed on a single integrated circuit.

15 Claims, 9 Drawing Sheets

PLANAR GRAPHENE SEMI-CYCLOTRONS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

BACKGROUND

1. Field

The present disclosure generally relates to solid state nanoscale radio frequency (RF) emitters.

2. Discussion of the Related Art

A variety of applications and devices may benefit from the use of one or more precise and stable high frequency emitters. Examples of such applications and devices include ultra-high speed computers, high precision scanners, radars, radio frequency detectors, and applications configured to record images observed through RF-opaque objects without the use of ionizing radiation.

Conventionally, emitters operating at frequencies of about 300 gigahertz have not been extremely well stabilized in their frequency response. However, higher frequency, stable, output radiation is desirable, and with the advent of graphene, the design of an emitter configured, as disclosed herein, to operate in the frequency range of about 300 gigahertz to 3 terahertz has become possible. A stable high frequency gigahertz and/or terahertz emitter, as disclosed herein, is therefore desirable.

SUMMARY

In various embodiments, various emitters and emitter systems are disclosed. For instance, in various embodiments, an emitter can comprise a substrate, an insulator bonded to the substrate, a graphene layer bonded to the insulator, a first electrical contact, and a second electrical contact. The first electrical contact can be bonded over a first portion of the graphene layer, and the second electrical contact can be bonded over a second portion of the graphene layer. The graphene layer electrically couples the first electrical contact and the second electrical contact and is configured to receive the application of a pulsed input voltage between the first electrical contact and the second electrical contact and to radiate radio frequency (RF) energy. An emitter system can comprise a plurality of emitters, each disposed on a single integrated circuit.

Moreover, in various embodiments, an emitter can comprise a substrate, an insulator bonded to the substrate, a graphene layer bonded to the insulator, a first electrical contact, a second electrical contact, and a photoelectric element. The first electrical contact can be bonded over a first portion of the graphene layer, and the second electrical contact can be bonded over a second portion of the graphene layer. The graphene layer electrically couples the first electrical contact and the second electrical contact and is configured to receive the application of a DC bias voltage between the first electrical contact and the second electrical contact. The emitter can be configured to supply a pulsed burst of photoelectric energy (electrons) to the graphene layer in response to light shining upon the photoelectric element, which can cause the emitter to radiate RF energy.

BRIEF DESCRIPTION OF THE DRAWINGS

The features and advantages of the present disclosure will become more apparent from the detailed description set forth below when taken in conjunction with the drawings.

DETAILED DESCRIPTION OF THE ILLUSTRATED EMBODIMENTS

It is to be understood that the description above and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

In accordance with various embodiments, a solid state nanoscale RF emitter is generally disclosed. In some instances, embodiments of the invention may also be referred to as a planar graphene semi-cyclotron(s). A person having ordinary skill in the art will recognize that a cyclotron is a type of particle accelerator that typically employs two semicircle electrodes. However, embodiments of the invention, employ embodiments using a single half circle electrode.

The emitter may be configured to oscillate in the range of about 300 gigahertz (GHz) to 3 terahertz (THz). In various embodiments, the emitter can comprise a semicircular or semi-annular emitter. As described in additional detail below, the emitter comprises a graphene layer through which electrons can travel. As electrons travel through the graphene layer, the emitter radiates energy in a direction that is substantially normal to the direction of travel by the electrons. An externally applied magnetic (and/or electromagnetic) field can, in some embodiments, be applied to the emitter to control the trajectory taken be electrons in the graphene layer and thereby the frequency of the energy radiated by the emitter (i.e., the emitter output).

The solid state nanoscale emitter can therefore, as disclosed herein, operate as a precise (output signal frequency regulated) and stable (output signal waveform regulated) gigahertz and/or terahertz radio frequency emitter. The emitter may be useful for a variety of applications, such as, for example, applications related to ultra-high speed computers, high precision scanners, RADAR(s), RF detectors, antennas, pulse generators, scanning devices, applications requiring an emitter for imaging through opaque objects without the use of ionizing radiation, and the like.

The emitter is depicted in the figures as being surrounded by air, also sometimes referred to as free space. Other surrounding materials such as, for example, water or oil, may also be used depending on application specific-conditions. The various embodiments disclose material layers that are associated with adjacent layers by bonding. It is understood that bonding includes any of the various bonding methods known to those having ordinary skill in the art, including, but not limited to mechanical bonding, chemical bonding, van der Waals bonding, heat bonding, pressure bonding, dipole interaction bonding, and/or ionic bonding.

Embodiments disclose semiconductor materials, such as semiconductor substrates. A semiconductor substrate may comprise any suitable semiconductor material such as, for example, any silicon, class III-V semiconductors, class II-VI semiconductors, binary semiconductors, ternary semiconductors, and/or organic semiconductors.

Embodiments further disclose graphene layers. It is understood that graphene is a material that is more than 95 percent carbon by weight and includes at least one, one-atom-thick planar layer comprised of sp2-bonded carbon atoms that are densely packed in a honeycomb crystal lattice and held together by strong van der Waals forces. The graphene material may contain one layer of carbon atoms or a plurality of layers of carbon atoms.

Figure 1:
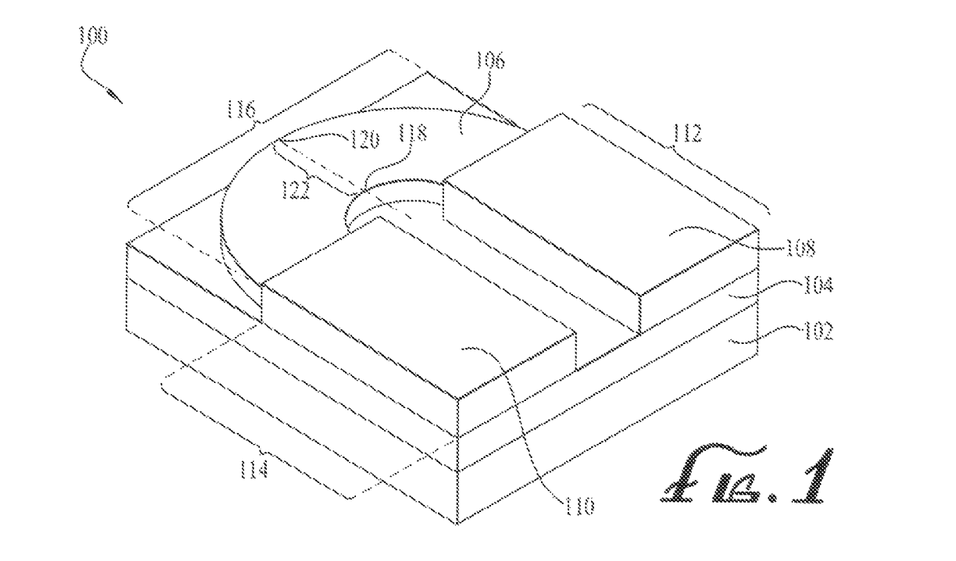
FIG. 1 is a perspective view of a solid state nanoscale emitter, in accordance with various embodiments.

Accordingly, and with reference now to FIG. 1, a perspective view of a solid state nanoscale emitter 100 is shown. The emitter 100 comprises a substrate 102, an insulator 104 bonded to the substrate 102, a graphene layer 106 bonded to the insulator 104, a first electrical contact 108, and a second electrical contact 110. The first electrical contact 108 is, in various embodiments, bonded over a first portion 112 of the graphene layer 106. Similarly, the second electrical contact 110 is, in various embodiments, bonded over a second portion 114 of the graphene layer 106.

The graphene layer 106 electrically couples the first electrical contact 108 to the second electrical contact 110. The graphene layer 106 is further configured to receive the application of a pulsed and/or DC bias input voltage between the first electrical contact 108 and the second electrical contact 110. As discussed in greater detail below, the graphene layer 106 radiates RF energy, in response to the pulsed input voltage, in a direction that is substantially normal to the direction in which electrons travel in the graphene layer 106.

As shown, the graphene layer 106 can comprise a semicircular portion 116. The semicircular portion 116 may be defined as a substantially planar annulus having an inner radius 118 and an outer radius 120, where the inner radius 118 and the outer radius 120 together define the width 122 of the annulus. The graphene layer 106 can further comprise each of the first portion 112 and the second portion 114, both of which can extend away from the semicircular portion 116 in substantially straight lines. Thus, the graphene layer 106 comprises, in various embodiments, a "U" or "horseshoe" shape, which may also be referred to as "substantially U-shaped" or "substantially horseshoe-shaped."

Figure 2:
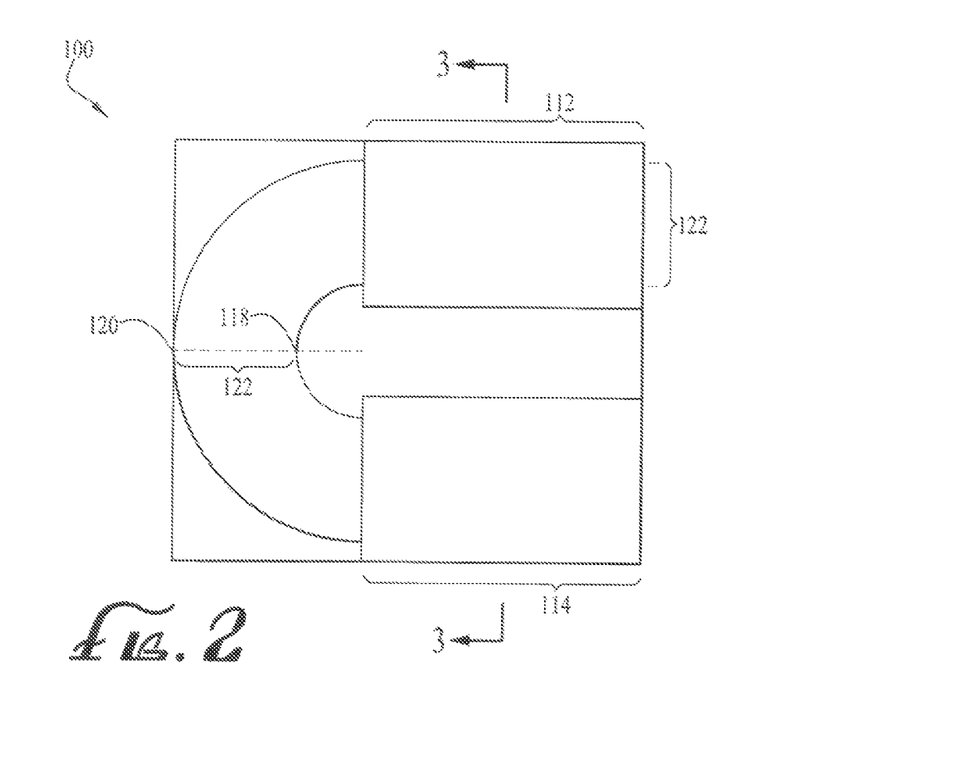
FIG. 2 is a top view of a solid state nanoscale emitter, showing a cut plane 3-3, in accordance with various embodiments.

The "legs," or first portion 112 and the second portion 114, can extend to any suitable length. Likewise, the graphene layer 106 can be constructed to any suitable width 122, and the inner radius 118 and outer radius 122 can be of any suitable measurement. For example, as shown in FIG. 2, the inner radius can measure 95 nanometers, and the outer radius can measure 955 nanometers. However, any other radial measurements in the range of 95 nanometers to 955 nanometers are contemplated by and within the scope of this disclosure. In addition, the width 122 of the graphene layer 106 can comprise any measurement in the range of 300 nanometers to 870 nanometers, and the length of the first portion 112 and second portion 114 of the graphene layer 106 can, in various embodiments, extend to any length in the range of 580 nanometers to 1740 nanometers.

Figure 3:
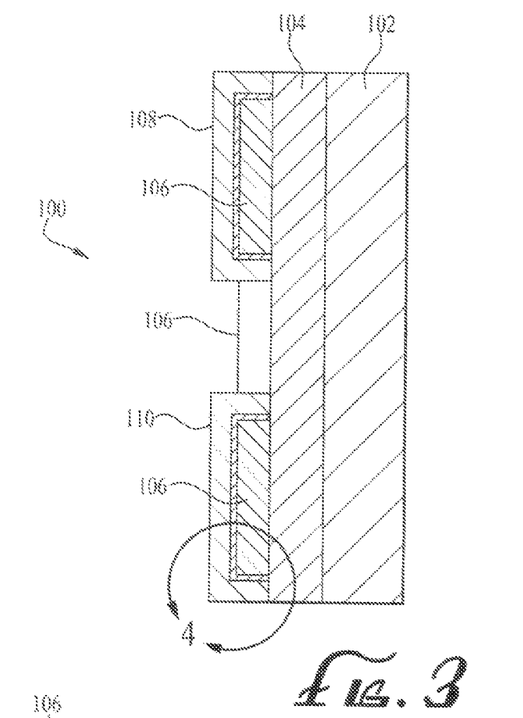
FIG. 3 is a cross-sectional view, perpendicular to the cut plane 3-3, of a solid state nanoscale emitter, in accordance with various embodiments.

With reference now to FIG. 3, a cross-sectional view of a solid state nanoscale emitter 100 is shown. The cross-section shown is perpendicular to the cut plane 3-3, as shown in FIG. 2. The substrate 102, insulator 104, graphene layer 106, first electrical contact 108, and second electrical contact 110 are shown. In addition, a cut-out or close-up section 4 is defined. In various embodiments, the substrate 102 can comprise any suitable substrate, such as, for example, silicon (Si) and can comprise any suitable thickness. Further, in various embodiments, the insulator 104 can comprise any suitable insulating material, such as, for example, silicon dioxide (SiO2) and can be any suitable thickness. Suitable thickness of the insulator 104 can be in the range of about 100 nanometers to about 500 nanometers.

Figure 4:
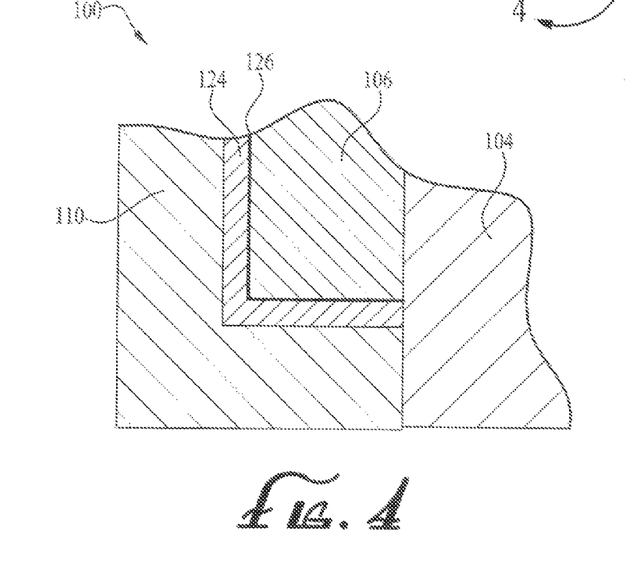
FIG. 4 is a close-up view of a portion of the cross-sectional view of FIG. 3.

With attention to FIG. 4, the cutout section 4, illustrating a portion of the cross-sectional view of the solid state nanoscale emitter 100, is shown. As depicted, in various embodiments, the second electrical contact 110 can comprise gold (Au) and can be about 40 nanometers in thickness. The second electrical contact 110 can overlay and/or be bonded over a layer of palladium (Pd) 124 that is about 10 nanometers in thickness. Moreover, and in various embodiments, the layer of palladium 124 can overlay and/or be bonded to a layer of titanium (Ti) 126 that is about 0.5 nanometers in thickness, and the layer of titanium 126 can overlay and/or be bonded to the graphene layer 106, which can, as discussed elsewhere herein, overlay and/or be bonded to the insulator 104, which can overlay and/or be bonded to the substrate 102. Although not shown in identical detail, the same construction can apply to the first electrical contact 108.

In operation, and with returning reference now to FIG. 1, an input voltage can be applied (e.g., by a voltage source) between the first electrical contact 108 and the second electrical contact 110. The voltage source is not shown in the figures since voltage sources are well known. The input voltage can be intermittent, or pulsed, such that a voltage between the first electrical contact 108 and the second electrical contact 110 is developed for a period of time, reduced (e.g., to a zero or substantially zero voltage) for a period of time, developed again for a period of time, reduced for a period of time, and so on in an "on" and "off" or "high" and "low" pattern for any suitable duration. As the input voltage is pulsed high, electrons (comprising an electrical current) travel within the graphene layer 106 from the first contact 108 towards the second contact 110. As electrons travel within the graphene layer 106, an electromagnetic field is generated normal to the direction of travel of each electron. Thus, as each electron travels within the substantially planar graphene layer 106, an electromagnetic field is generated substantially normal to the plane defined by the graphene layer 106 (i.e., in the case of FIG. 1, "out of the page"). In other words, although each electron travels along the radius of the arc defined by the semicircular portion 116 of the graphene layer 106, each electron generates an electromagnetic field that is normal to its two-dimensional direction of travel—i.e., normal to the plane defined by the semicircular portion 116 of the graphene layer 106.

The frequency of the output signal generated by the emitter 100 as electrons travel through the graphene layer 106 is dependent upon the radius of the arc taken by electrons as they travel. In general, a smaller radius of travel results in a higher frequency output signal, while a larger radius of travel results in a lower frequency output signal. For example, where electrons travel through the graphene layer 106 along the outer radius 120, the output signal can have a frequency of about 300 gigahertz, while electrons traveling along the inner radius 118 can generate an output signal having a frequency of about 3 terahertz. Electrons traveling between the inner radius 118 and outer radius 120 can generate output signals having frequencies in the range of 300 gigahertz to 3 terahertz.

Figure 5:
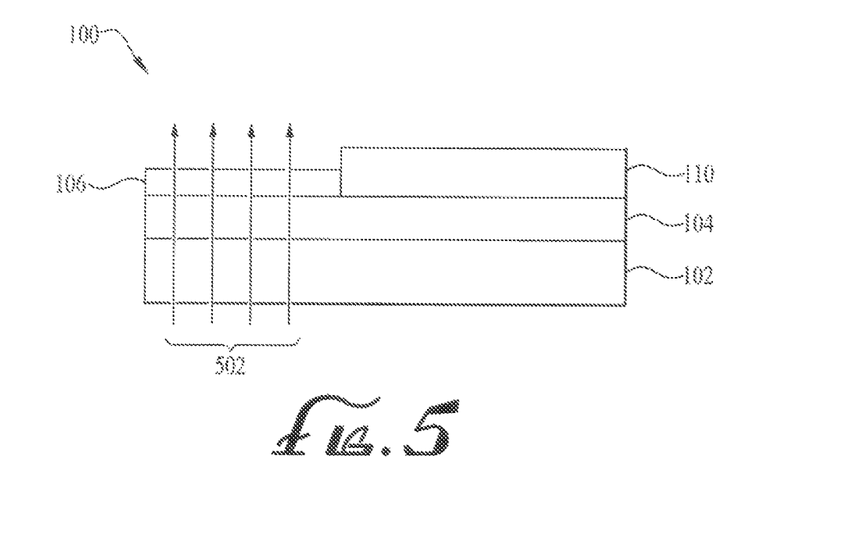
FIG. 5 is a side view of a solid state nanoscale emitter, in which the emitter is exposed to an externally applied electromagnetic field and in accordance with various embodiments.

Therefore, as shown with respect to FIG. 5, the frequency of the signal output by the emitter 100 can be adjusted or "tuned" by the application of a (varying or variable) magnetic and/or electromagnetic field 502 to the emitter 100. More particularly, a magnetic field 502 can, in various embodiments, be applied to the graphene layer 106 such that, as electrons travel through the graphene layer 106, their trajectories are influenced by the magnetic field 502. For example, the magnetic field 502 can be applied over a range of field strengths, such that electrons travel along a particular radius within the graphene layer 106. Therefore, as described above, as electrons are guided towards the outer radius 120, the frequency of the output signal can be reduced, while as electrons are guided towards the inner radius 118, the frequency of the output signal can be increased. Thus, the frequency of the output signal can be tuned through the use of the magnetic field 502 to any suitable value in the range of 300 gigahertz and 3 terahertz. The magnetic field strength can range, in various embodiments, from 0.105 Teslas to 0.262 Teslas.

Figure 6:
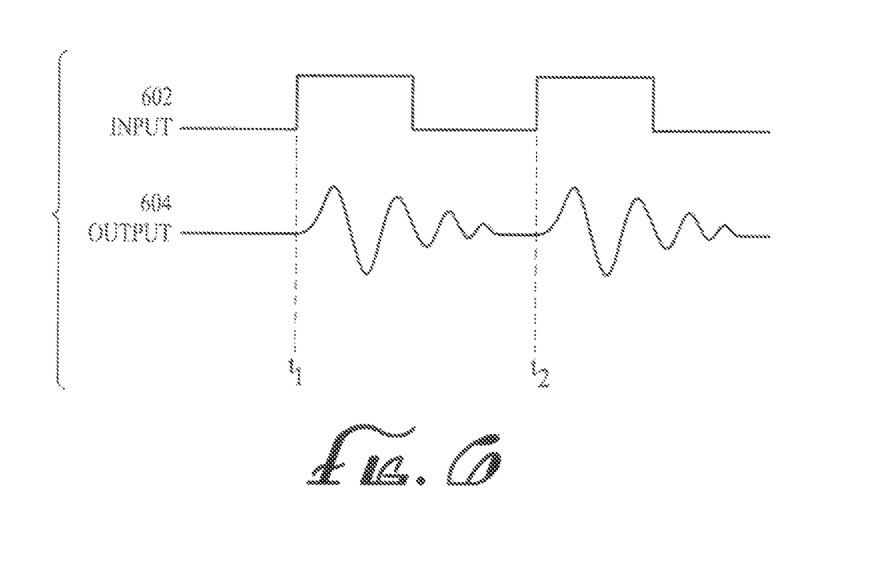
FIG. 6 is a timing diagram of an example input waveform and an example output waveform of a solid state nanoscale emitter, in accordance with various embodiments.

With brief reference to FIG. 6, an example timing diagram of an example input signal 602 and an example output signal 604 are depicted. As shown, and as described above, the input signal 602 can comprise a pulsed voltage, or a square wave. In various embodiments, as the square wave peaks (or goes high), the emitter 100 can generate a sinusoidal output signal 604 that decays in amplitude over time. In other words, the emitter 100 can generate a series of sinusoidal outputs 604 that decay in amplitude over time. The output signal 604 further oscillates in frequency, as described herein, according to field strength of the magnetic field 502 in the range of 300 gigahertz to 3 terahertz. Thus, the emitter 100 is capable of generating a very stable, very well-modulated, output signal 604.

In various embodiments, a plurality of emitters 100 can be disposed or manufactured as part of a single integrated circuit. For instance, in some embodiments, an integrated circuit can include about 60 million emitters 100. This number of emitters can be spread out over an integrated circuit space that is about 16 inches square in area. Thus, in operation, the RF energy radiated by each emitter 100 on the integrated circuit can add by a process of linear superposition during transmission (e.g., transmission through free space), resulting in a combined signal having a much greater strength than the strength of any individual signal generated by a particular emitter 100.

Figure 7:
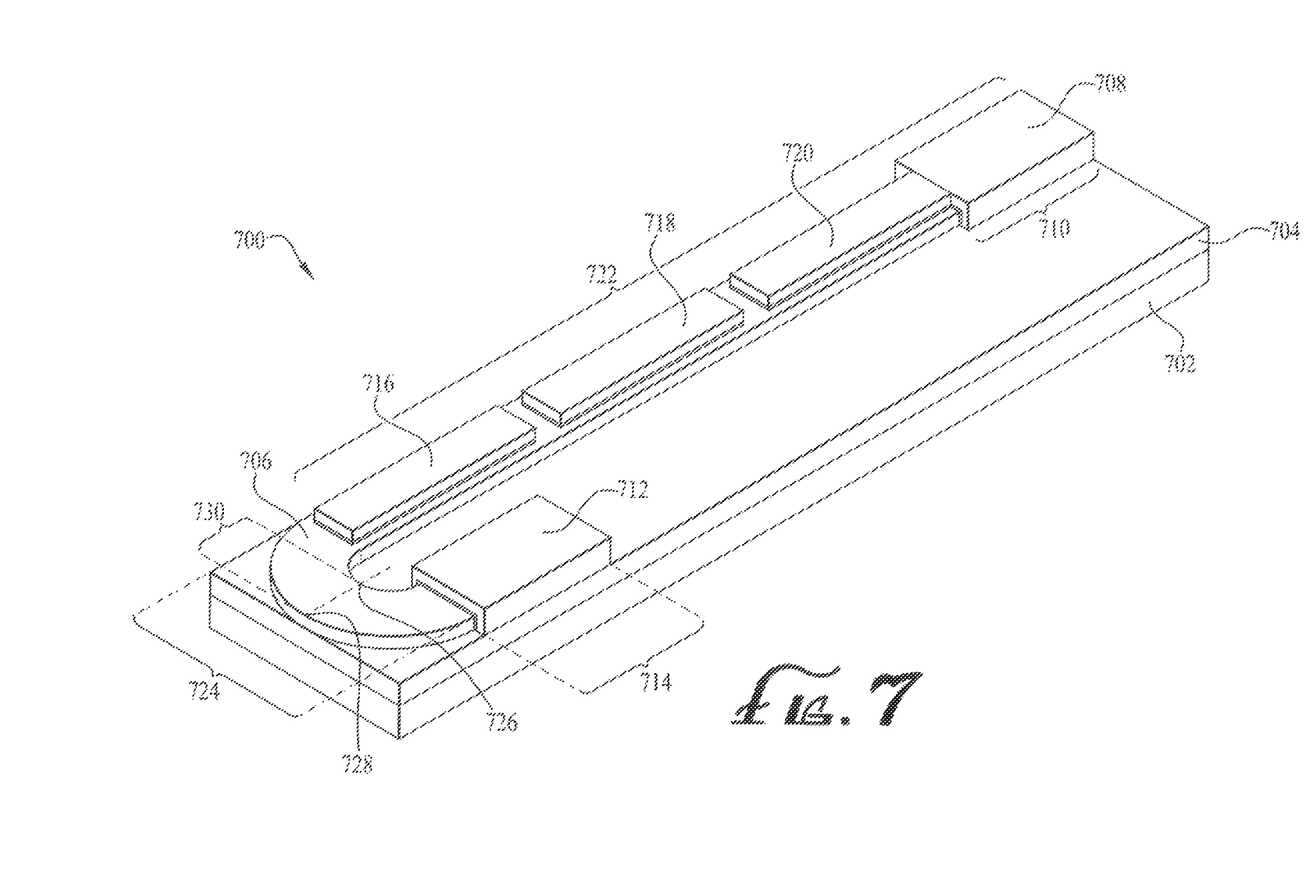
FIG. 7 is a perspective view of a solid state nanoscale emitter having a plurality of photoelectric elements, in accordance with various embodiments.

With attention now to FIG. 7, a perspective view of a solid state nanoscale emitter 700 having a plurality of photoelectric elements is shown. Like emitter 100, the emitter 700 can comprise a substrate 702, an insulator 704 bonded to the substrate 702, a graphene layer 706 bonded to the insulator 704, a first electrical contact 708 bonded over a first portion 710 of the graphene layer 706, and a second electrical contact 712 bonded over a second portion 714 of the graphene layer 706.

The emitter 700 further comprises a plurality of photoelectric elements 716, 718, and 720. In various embodiments, any number of photoelectric elements can be employed. The photoelectric elements 716, 718, and 720 can comprise any elements that receive light energy and radiate, in response, electrons. In other words, a photoelectric element 716, 718, and 720 converts received light energy to radiated electrons. The photoelectric elements 716, 718, and 720 can be bonded to or otherwise mounted over an extended portion 722 of the graphene layer 706.

Like the graphene layer 106 of emitter 100, the graphene layer 706 of emitter 700 electrically couples the first electrical contact 708 to the second electrical contact 712. The graphene layer 706 is further configured to receive the application of a DC bias voltage between the first electrical contact 708 and the second electrical contact 712. In various embodiments, the DC bias voltage is a steady (or substantially steady) voltage. As discussed in greater detail herein, the graphene layer 706 radiates RF energy, in response to a pulsed supply of photoelectrically generated electrons, in a direction that is substantially normal direction in which electrons travel in the graphene layer 706.

As shown, the graphene layer 706 can comprise a semi-annular or semicircular portion 724. The semicircular portion 724 may be defined as a substantially planar annulus having an inner radius 726 and an outer radius 728, where the inner radius 726 and the outer radius 728 together define the width 730 of the annulus. The graphene layer 706 can further comprise the extended portion 722 (which includes the first portion 710 over which the first electrical contact 708 is mounted) and the second portion 714, both of which can extend away from the semicircular portion 724 in substantially straight lines. Thus, the graphene layer 706 comprises, in various embodiments, a "candy cane" shape.

Figures 8, 9:
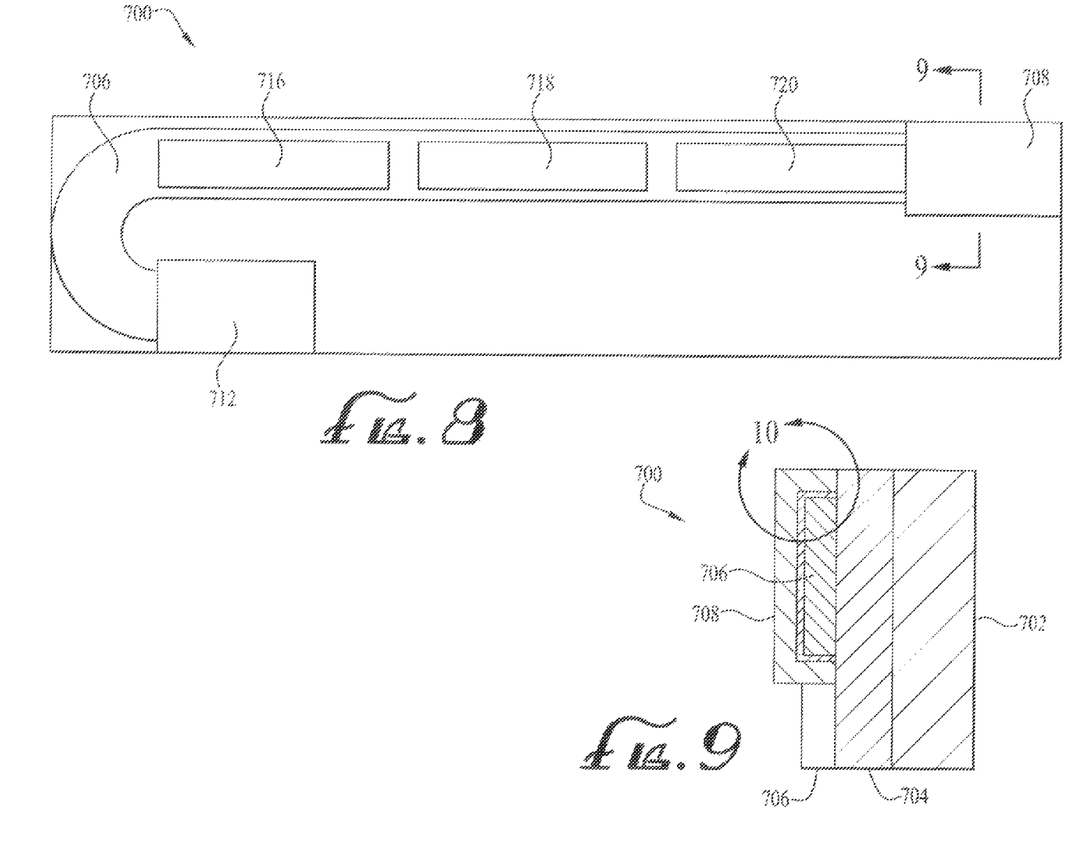
FIG. 8 is a top view, showing a cut plane 9-9, of a solid state nanoscale emitter having a plurality of photoelectric elements, in accordance with various embodiments.
FIG. 9 is a cross-sectional view, perpendicular to the cut plane 9-9, of a solid state nanoscale emitter having a plurality of photoelectric elements, in accordance with various embodiments.

The "legs," or extended portion 722 and the second portion 714, can extend to any suitable length. Likewise, the graphene layer 706 can be constructed to any suitable width 730, and the inner radius 726 and outer radius 728 can be of any suitable measurement. For example, as shown at FIG. 8, the inner radius 726 can measure 95 nanometers, and the outer radius 728 can measure 955 nanometers. However, any other radial measurements in the range of 95 nanometers to 955 nanometers are contemplated by and within the scope of this disclosure. In addition, the width 730 of the graphene layer 706 can comprise any measurement in the range of 290 nanometers to 860 nanometers. The length of the first portion 710 and second portion 714 of the graphene layer 706 can, in various embodiments, extend to any length in the range of 580 nanometers to 1740 nanometers, while the extended portion 722 can measure in the range of 1000 nanometers to 3100 nanometers. The width of the first electrical contact 708 and second electrical contact 712 can comprise any measurement in the range of 300 nanometers to 870 nanometers. A photoelectric element 716, 718, or 720 can extend along the graphene layer 706 within the range of 400 nanometers to 1000 nanometers, and each photoelectric element 716, 718, and 720 can be separated from an adjacent photoelectric element by 50 nanometers to 100 nanometers.

With reference now to FIG. 9, a cross-sectional view of a solid state nanoscale emitter 700 having a plurality of photoelectric elements is shown. The cross-section shown is perpendicular to the cut plane 9-9, as shown at FIG. 8. The substrate 702, insulator 704, graphene layer 706, and first electrical contact 708 are shown. In addition, a close-up or cutout section 10 is defined. In various embodiments, the substrate 702 can comprise any suitable substrate, such as, for example, silicon (Si) and can comprise any suitable thickness. Further, in various embodiments, the insulator 704 can comprise any suitable insulating material, such as, for example, silicon dioxide (SiO2) and can be any suitable thickness. Suitable thickness of the insulator 704 can be in the range of about 100 nanometers to about 500 nanometers.

Figure 10:
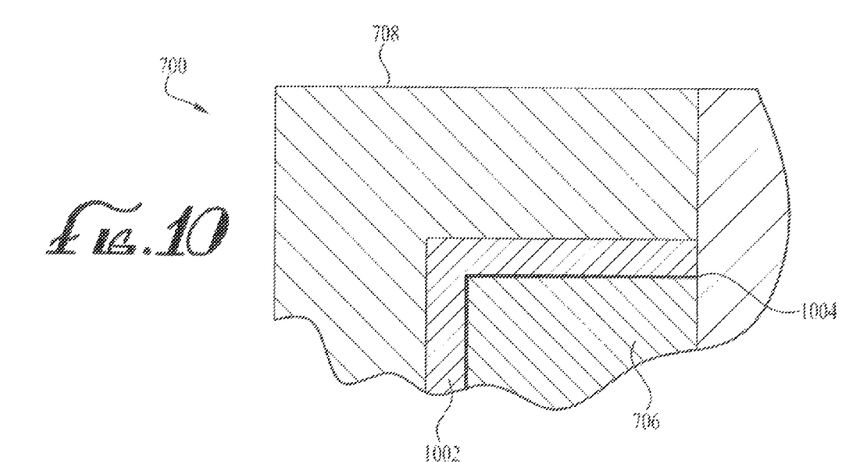
FIG. 10 is a close-up view of a portion the cross-sectional view of FIG. 9.

With attention to FIG. 10, the cutout section 10, illustrating a portion of the cross-sectional view of the solid state nanoscale emitter 700, is shown. As depicted, in various embodiments, the first electrical contact 708 can comprise gold (Au) and can be about 40 nanometers in thickness. The contact 708 can overlay and/or be bonded over a layer of palladium (Pd) 1002 that is about 10 nanometers in thickness. Moreover, and in various embodiments, the layer of palladium 1002 can overlay and/or be bonded to a layer of titanium (Ti) 1004 that is about 0.5 nanometers in thickness, and the layer of titanium 1004 can overlay and/or be bonded to the graphene layer 706, which can, as discussed elsewhere herein, overlay and/or be bonded to the insulator 704, which can in turn overlay and/or be bonded to the substrate 702. Although not shown in identical detail, the same construction can apply to the second electrical contact 712.

In operation, and with returning reference now to FIG. 7, a DC bias input voltage can be applied (e.g., by a voltage source) between the first electrical contact 708 and the second electrical contact 712. Further, light (e.g., laser light) can be intermittently shined on one or more of the photoelectric elements 716, 718, and 720. As light is incident on any of the photoelectric elements 716, 718, and 720, the photoelectric elements can be excited to radiate electrons on the graphene layer 706, over which the photoelectric elements 716, 718, and 720 are disposed. Thus, electrons can be injected by the photoelectric elements 716, 718, and 720 for a period of time, reduced (e.g., to zero or substantially zero) for a period of time, injected again for a period of time, reduced for a period of time, and so on in an "on" and "off" or "high" and "low" pattern for any suitable duration. As the electrons are injected into the graphene layer 706, each electron travels from the first contact 708 towards the second contact 712 in accordance with the DC bias voltage between the first contact 708 and the second contact 712. Accordingly, as electrons travel within the graphene layer 706, an electromagnetic field is generated normal to the direction of travel of each electron. Thus, as each electron travels within the substantially planar graphene layer 706, an electromagnetic field is generated substantially normal to the plane defined by the graphene layer 706 (i.e., in the case of FIG. 7, "out of the page"). In other words, although each electron travels along the radius of the arc defined by the semicircular portion 724 of the graphene layer 706, each electron generates an electromagnetic field that is normal to its two-dimensional direction of travel—i.e., normal to the plane defined by the semicircular portion 724 of the graphene layer 706.

As described above with reference to emitter 100, the frequency of the output signal generated by the emitter 700 as electrons travel through the graphene layer 706 is dependent upon the radius of travel taken by electrons. In general, a smaller radius of travel results in a higher frequency output signal, while a larger radius of travel results in a lower frequency output signal. For example, where electrons travel through the graphene layer 706 along the outer radius 728, the output signal can have a frequency of about 300 gigahertz, while electrons traveling along the inner radius 726 can produce an output signal having a frequency of about 3 terahertz. Electrons traveling between the inner radius 726 and outer radius 726 can produce output signals having frequencies in the range of 300 gigahertz to 3 terahertz.

Figure 11:
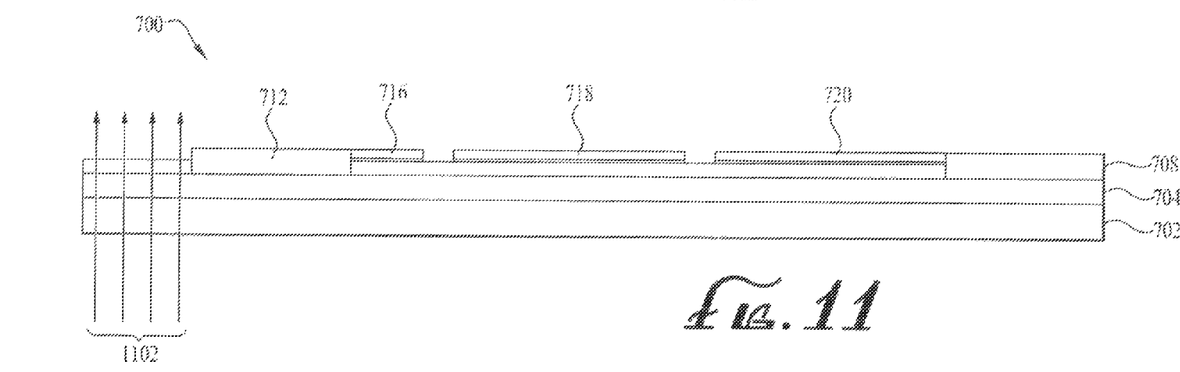
FIG. 11 is a side view of a solid state nanoscale emitter having a plurality of photoelectric elements, in accordance with various embodiments.

Therefore, as shown with respect to FIG. 11, the frequency of the signal output by the emitter 700 can be adjusted or tuned by the application of a (varying or variable) magnetic and/or electromagnetic field 1102 to the emitter 700. More particularly, a magnetic field 1102 can, in various embodiments, be applied to the graphene layer 706 such that, as electrons travel through the graphene layer 706, their trajectories are influenced by the magnetic field 1102. For example, the magnetic field 1102 can be applied over a range of field strengths, such that electrons travel along a particular radius within the graphene layer 706. Therefore, as described above, as electrons are guided toward the outer radius 728, the frequency of the output signal can be reduced, while as electrons are guided toward the inner radius 726, the frequency of the output signal can be increased. Thus, the frequency of the output signal can be tuned through the use of the magnetic field 1102 to any suitable value in the range of 300 gigahertz and 3 terahertz. The magnetic field 1102 strength can range, in various embodiments, from 0.105 Teslas to 0.262 Teslas.

Thus, the emitter 700 can generate, in response to a pulsed supply of photoelectrically generated electrons by one or more photoelectric elements 716, 718, and 720, a sinusoidal output signal that decays in amplitude over time. In other words, the emitter 700 can generate a series of sinusoidal outputs that decay in amplitude over time. The output signal further oscillates in frequency, as described herein, according to field strength of the magnetic field 1102 in the range of 300 gigahertz to 3 terahertz. Thus, the emitter 700 is capable of generating a very stable, very well-modulated output signal 604.

In various embodiments, a plurality of emitters 700 can be disposed or manufactured as part of a single integrated circuit. For instance, in some embodiments, an integrated circuit can include about 60 million emitters 700. These emitters can be spread out over a planar integrated circuit space that is 16 inches square in area. Thus, in operation, the RF energy radiated by each emitter 700 on the integrated circuit can add by a process of linear superposition during transmission (e.g., transmission through free space), resulting in a combined signal having a much greater strength than the strength of any individual signal generated by a particular emitter 700.

Figure 12:
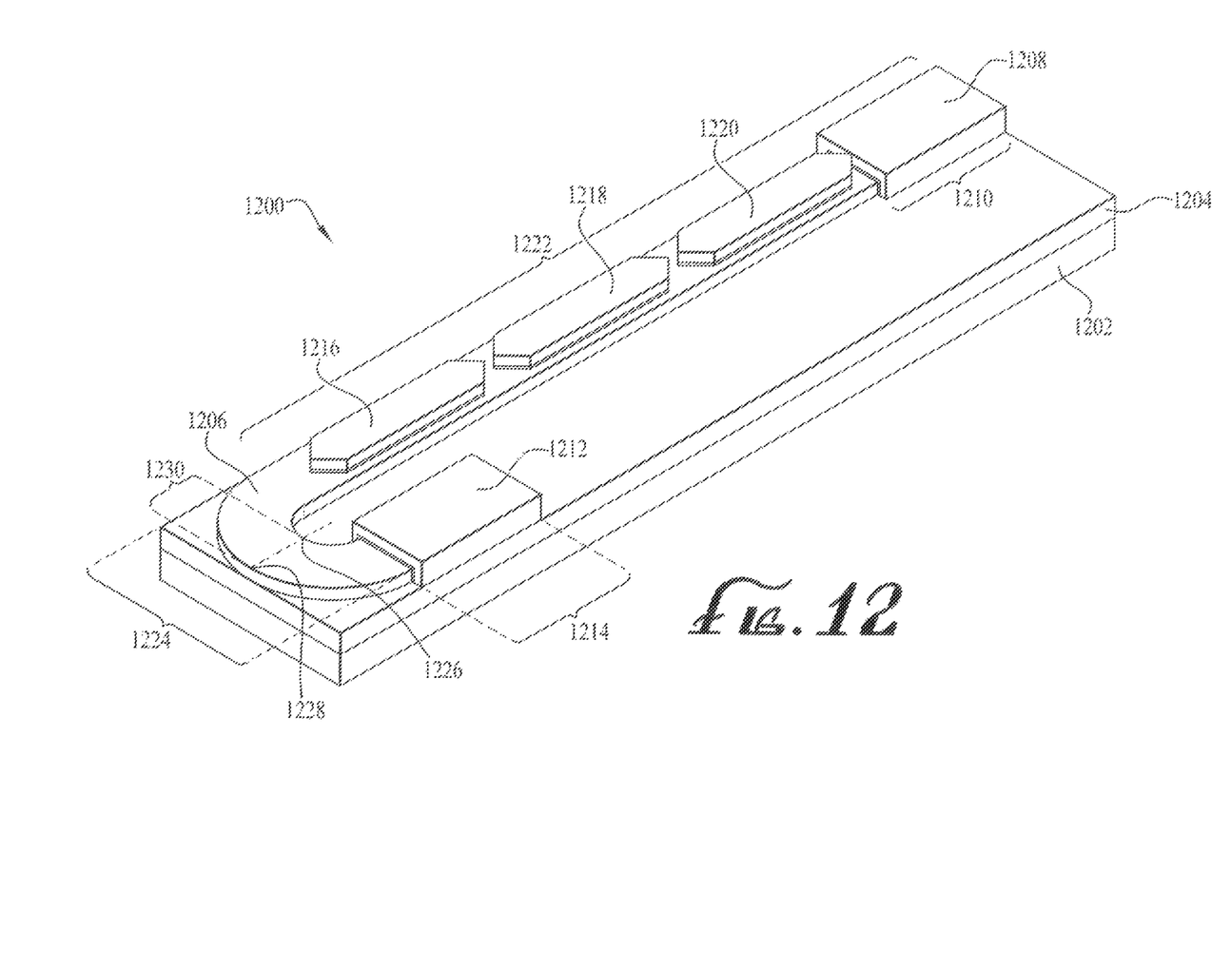
FIG. 12 is a perspective view of a solid state nanoscale emitter having a plurality of apexed photoelectric elements, in accordance with various embodiments.

With attention now to FIG. 12, a perspective view of a solid state nanoscale emitter 1200 having a plurality of apexed photoelectric elements is shown. Like emitters 100 and 700, the emitter 1200 can comprise a substrate 1202, an insulator 1204 bonded to the substrate 1202, a graphene layer 1206 bonded to the insulator 1204, a first electrical contact 1208 bonded over a first portion 1210 of the graphene layer 1206, and a second electrical contact 1212 bonded over a second portion 1214 of the graphene layer 1206.

The emitter 1200 further comprises a plurality of apexed photoelectric elements 1216, 1218, and 1220. In various embodiments, any number of apexed photoelectric elements can be employed. The apexed photoelectric elements 1216, 1218, and 1220 can comprise any elements that receive light energy and radiate, in response, electric (or "photoelectric") energy. In other words, the apexed photoelectric elements 1216, 1218, and 1220 convert received light energy to radiated electrons. The apexed photoelectric elements 1216, 1218, and 1220 can be bonded to or otherwise mounted over an extended portion 1222 of the graphene layer 1206.

Like the graphene layers discussed elsewhere herein, the graphene layer 1206 of emitter 1200 electrically couples the first electrical contact 1208 to the second electrical contact 1212. The graphene layer 1206 is further configured to receive the application of a DC bias voltage between the first electrical contact 1208 and the second electrical contact 1212. In various embodiments, this is not a pulsed input voltage, as applied to emitter 100; rather, it is a steady (or substantially steady) DC bias voltage. As discussed in greater detail herein, the graphene layer 1206 radiates RF energy, in response to a pulsed supply of photoelectrically generated electrons, in a direction that is substantially normal to the direction in which electrons travel in the graphene layer 1206.

As shown, the graphene layer 1206 can comprise a semi-annular or semicircular portion 1224. The semicircular portion 1224 may be defined as a substantially planar annulus having an inner radius 1226 and an outer radius 1228, where the inner radius 1226 and the outer radius 1228 together define the width 1230 of the annulus. The graphene layer 1206 can further comprise the extended portion 1222 (which includes the first portion 1210 over which the first electrical contact 1208 is mounted) and the second portion 1214, both of which can extend away from the semicircular portion 1224 in substantially straight lines. Thus, the graphene layer 1206 comprises, in various embodiments, a "candy cane" shape.

Figure 13:
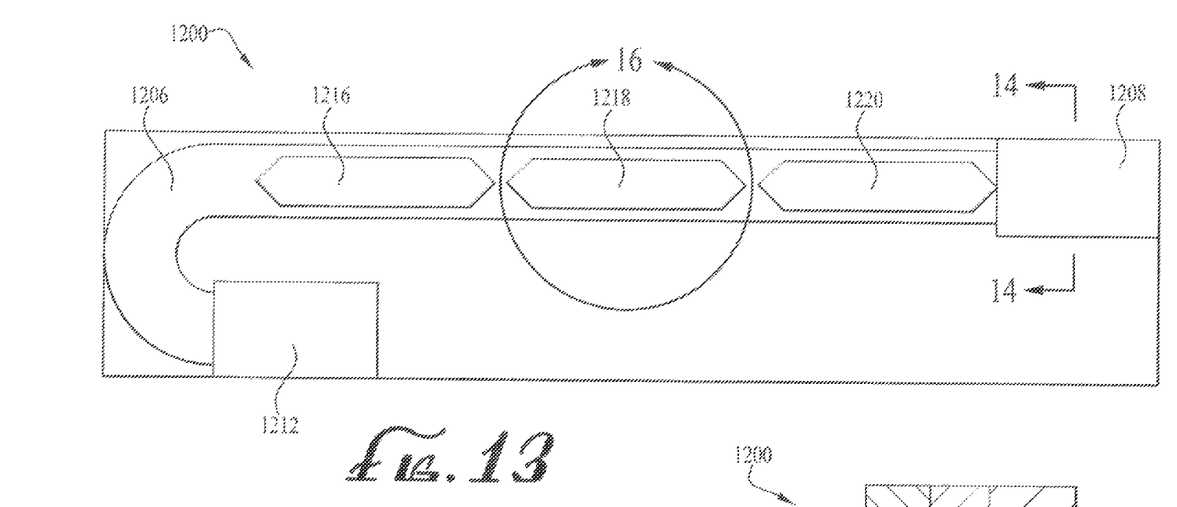
FIG. 13 is top view, showing a cut plane 14-14, of a solid state nanoscale emitter having a plurality of apexed photoelectric elements, in accordance with various embodiments.

The "legs," or extended portion 1222 and the second portion 1214, can extend to any suitable length. Likewise, the graphene layer 1206 can be constructed to any suitable width 1230, and the inner radius 1226 and outer radius 1228 can be of any suitable measurement. For example, as shown at FIG. 13, the inner radius 1226 can measure 95 nanometers, and the outer radius 1228 can measure 955 nanometers. However, any other radial measurements in the range of 95 nanometers to 955 nanometers are contemplated by and within the scope of this disclosure. In addition, the width 1230 of the graphene layer 1206 can comprise any measurement in the range of 290 nanometers to 860 nanometers. The length of the first portion 1210 and second portion 1214 of the graphene layer 1206 can, in various embodiments, extend to any length in the range of 580 nanometers to 1740 nanometers, while the extended portion 1222 can measure in the range of 1000 nanometers to 3100 nanometers. The width of the first electrical contact 1208 and second electrical contact 1212 can comprise any measurement in the range of 300 nanometers to 870 nanometers. The apexed photoelectric elements 1216, 1218, and 1220 can extend along the graphene layer 1206 within the range of 400 nanometers to 1000 nanometers, and each apexed photoelectric elements 1216, 1218, and 1220 can be separated from an adjacent apexed photoelectric element by 50 nanometers to 100 nanometers (as between adjacent apexes).

An apexed photoelectric element 1216, 1218, and 1220 can include an apexed or apexed edge, as shown, as a means of shedding excess heat. That is, an apexed photoelectric element 1216, 1218, and 1220 can, because it has greater surface area than, for example, a rectangular photoelectric element, shed greater thermal energy than such an element. Thus, in various embodiments, such as where the apexed photoelectric elements 1216, 1218, and 1220 are being loaded with thermal energy by a laser, such apexed photoelectric elements 1216, 1218, and 1220 can be utilized to help shed excess thermal energy and so to cool the emitter 1200 during operation. In various embodiments, any other shape of photoelectric element may be used to regulate thermal energy, according, for example, to the energy radiated by the photoelectric element in conjunction with the thermal dissipation requirements associated with the emitter to which the photoelectric element is coupled.

Figure 14:
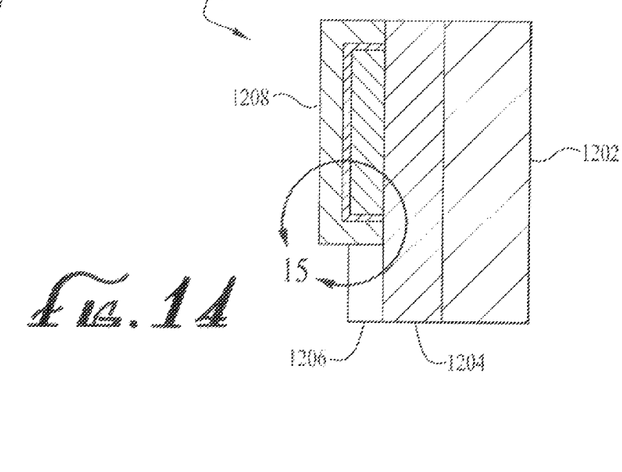
FIG. 14 is a cross-sectional view, perpendicular to the cut plane 14-14, of a solid state nanoscale emitter having a plurality of apexed photoelectric elements, in accordance with various embodiments.

With reference now to FIG. 14, a cross-sectional view of a solid state nanoscale emitter 700 having a plurality of apexed photoelectric elements is shown. The cross-section shown is perpendicular to the cut plane 14-14, as shown at FIG. 13. The substrate 1202, insulator 1204, graphene layer 1206, and first electrical contact 1208 are shown. In addition, a close-up view or cutout section 15 is defined. In various embodiments, the substrate 1202 can comprise any suitable substrate, such as, for example, silicon (Si) and can comprise any suitable thickness. Further, in various embodiments, the insulator 1204 can comprise any suitable insulating material, such as, for example, silicon dioxide (SiO2) and can be any suitable thickness, such as, for example, any thickness in the range of 100 nanometers to 500 nanometers.

Figure 15:
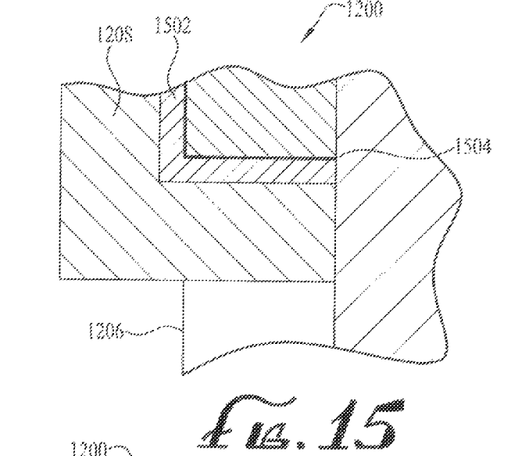
FIG. 15 is a close-up view of a portion the cross-sectional view of FIG. 14.

With attention to FIG. 15, the cutout section 15, illustrating a portion of the cross-sectional view of the solid state nanoscale emitter 1200, is shown. As depicted, in various embodiments, the first electrical contact 1208 can comprise gold (Au) and can be about 40 nanometers in thickness. The contact 1208 can overlay and/or be bonded over a layer of palladium (Pd) 1502 that is about 10 nanometers in thickness. Moreover, and in various embodiments, the layer of palladium 1502 can overlay and/or be bonded to a layer of titanium (Ti) 1504 that is about 0.5 nanometers in thickness, and the layer of titanium 1504 can overlay and/or be bonded to the graphene layer 1206, which can, as discussed elsewhere herein, overlay and/or be bonded to the insulator 1204, which can in turn overlay and/or be bonded to the substrate 1202. Although not shown in identical detail, the same construction can apply to the second electrical contact 1212.

Figure 16:
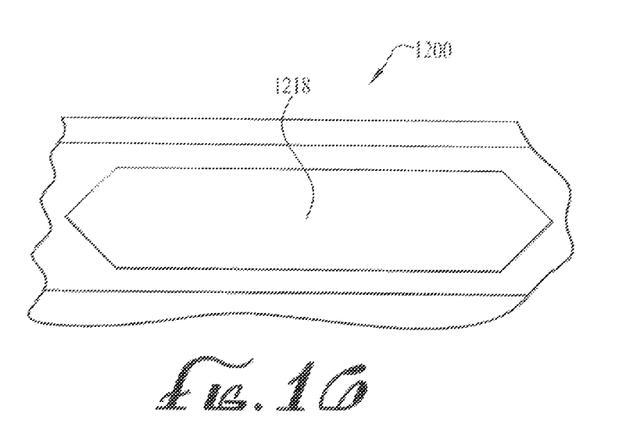
FIG. 16 is a close-up view of a portion of the top view of FIG. 13.

With brief regard to FIG. 16, a close-up or cutout section 16 (as defined at FIG. 15) illustrating a portion of the cross-sectional view of the solid state nanoscale emitter 1200, is shown. The cutout section 16 illustrates, in greater detail, the apexed photoelectric element 1218. As shown, the apexed photoelectric element 1218 (as well as the other apexed photoelectric elements 1216 and 1220) can comprise a width in the range from 100 nanometers to 870 nanometers. Likewise, each of the apexed photoelectric elements 1216, 1218, and 1220 can comprise a length in the range of 400 nanometers to 1000 nanometers (from apex to apex).

In operation, and with returning reference now to FIG. 12, a DC bias input voltage can be applied (e.g., by a voltage source) between the first electrical contact 1208 and the second electrical contact 1212. Further, light (e.g., laser light) can be intermittently shined on one or more of the photoelectric elements 1216, 1218, and 1220. As light is incident on any of the photoelectric elements 1216, 1218, and 1220, the photoelectric elements can be excited to radiate electrons on the graphene layer 1206, over which the photoelectric elements 1216, 1218, and 1220 are disposed. Thus, electrons can be injected by the photoelectric elements 1216, 1218, and 1220 for a period of time, reduced (e.g., to zero or substantially zero) for a period of time, injected again for a period of time, reduced for a period of time, and so on in an "on" and "off" or "high" and "low" pattern for any suitable duration. As the electrons are injected into the graphene layer 1206, each electron travels from the first contact 1208 towards the second contact 1212 in accordance with the DC bias voltage between the first contact 1208 and the second contact 1212. Accordingly, as electrons travel within the graphene layer 1206, an electromagnetic field is generated normal to the direction of travel of each electron. Thus, as each electron travels within the substantially planar graphene layer 1206, an electromagnetic field is generated substantially normal to the plane defined by the graphene layer 1206 (i.e., in the case of FIG. 12, "out of the page"). In other words, although each electron travels along the radius of the arc defined by the semicircular portion 1224 of the graphene layer 1206, each electron generates an electromagnetic field that is normal to its two-dimensional direction of travel—i.e., normal to the plane defined by the semicircular portion 1224 of the graphene layer 1206.

The frequency of the output signal generated by the emitter 1200 as electrons travel through the graphene layer 1206 is dependent upon the radius of the arc taken by electrons as they travel. In general, a smaller radius of travel results in a higher frequency output signal, while a larger radius of travel results in a lower frequency output signal. For example, where electrons travel through the graphene layer 1206 along the outer radius 1228, the output signal can have a frequency of about 300 gigahertz, while electrons traveling along the inner radius 1226 can produce an output signal having a frequency of about 3 terahertz. Electrons traveling between the inner radius 1226 and outer radius 1228 can produce output signals having frequencies in the range of 300 gigahertz to 3 terahertz.

Figure 17:
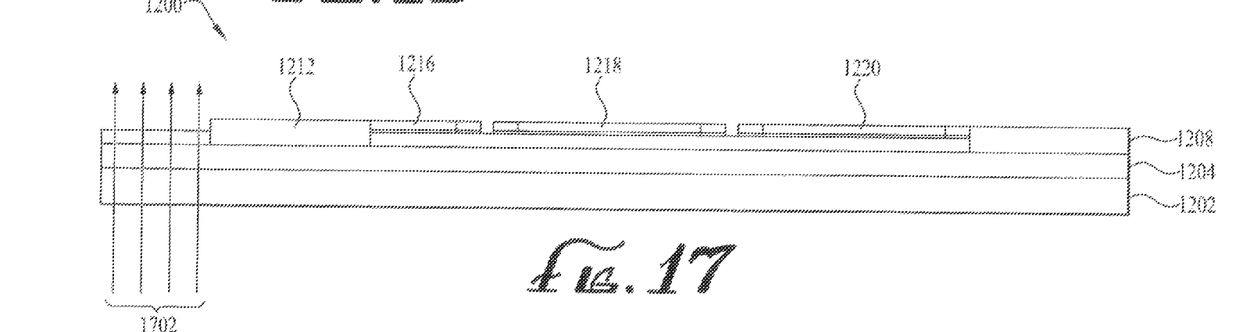
FIG. 17 is a side view of a solid state nanoscale emitter having a plurality of apexed photoelectric elements, in accordance with various embodiments.

Therefore, as shown with respect to FIG. 17, the frequency of the signal output by the emitter 1200 can be adjusted or tuned by the application of a (varying or variable) magnetic and/or electromagnetic field 1702 to the emitter 1200. More particularly, a magnetic field 1702 can, in various embodiments, be applied to the graphene layer 1206 such that, as electrons travel through the graphene layer 1206, their trajectories are influenced by the magnetic field 1702. For example, the magnetic field 1702 can be applied over a range of field strengths, such that electrons travel along a particular radius within the graphene layer 1206. Therefore, as described above, as electrons are guided towards the outer radius 1228, the frequency of the output signal can be reduced, while as electrons are guided towards the inner radius 1226, the frequency of the output signal can be increased. Thus, the frequency of the output signal can be tuned through the use of the magnetic field 1702 to any suitable value in the range of 300 gigahertz and 3 terahertz. The magnetic field 1702 strength can range, in various embodiments, from 0.105 Teslas to 0.262 Teslas.

Thus, as described above with reference to the emitter 700, the emitter 1200 can generate, in response to a plurality of pulsed photoelectric input voltages, a sinusoidal output signal that decays in amplitude over time. In other words, the emitter 1200 can generate a series of sinusoidal outputs that decay in amplitude over time. The output signal further oscillates in frequency, as described herein, according to field strength of the magnetic field 1702 in the range of 300 gigahertz to 3 terahertz. Thus, the emitter 1200 is capable of generating a very stable, highly output signal.

In various embodiments, a plurality of emitters 1200 can be disposed or manufactured as part of a single integrated circuit. For instance, in some embodiments, an integrated circuit can include about 60 million emitters 1200. These emitters can be spread out over a planar integrated circuit space that is about 16 inches square. Thus, in operation, the RF energy radiated by each emitter 1200 on the integrated circuit can add by a process of linear superposition during transmission (e.g., transmission through free space), resulting in a combined signal having a much greater strength than the strength of any signal produced by a particular emitter 1200.

It is apparent that embodiments of the invention are configurable to discriminate frequency and particularly in the terahertz region. The result is highly synchronized terahertz radiation that is predictable and well-regulated. Embodiments of the invention can be stand-alone or included in a layered or matrix orientation as well as two-dimensional or three-dimensional. Embodiments of the invention may also be presented as multiple layer structures fabricated by methods that have demonstrated capability for rapid scale-up for mass production of large area devices.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. An emitter, comprising:
a substrate;
an insulator bonded to said substrate;
a graphene layer bonded to said insulator;
a first electrical contact and a second electrical contact, said first electrical contact bonded over a first portion of said graphene layer and said second electrical contact bonded over a second portion of said graphene layer;
wherein said graphene layer electrically coupled between said first electrical contact and said second electrical contact, said graphene layer is configured to receive a DC bias voltage between said first electrical contact and said second electrical contact; and
a plurality of photoelectric elements bonded to said graphene layer, said plurality of photoelectric elements configured to supply a pulsed burst of electrons to said graphene layer in response to light shining upon said plurality of photoelectric elements.

2. The emitter according to claim 1, wherein said graphene layer radiates radio frequency energy in response to said pulsed burst of photoelectrons.

3. The emitter according to claim 1, wherein said graphene layer comprises a semicircular portion.

4. The emitter according to claim 1, wherein said graphene layer comprises a semicircular portion, and wherein said graphene layer is configured to be adjusted to radiate radio frequency energy over a range of about 300 gigahertz to about 3 terahertz, the frequency depending upon the field strength of an externally applied magnetic field applied to said graphene layer.

5. The emitter according to claim 1, wherein said graphene layer comprises a portion of a substantially planar annulus having a first radius and a second radius, said first radius and said second radius together defining a width of said annulus.

6. An emitter, comprising:
a substrate;
an insulator bonded to said substrate;
a graphene layer bonded to said insulator;
a first electrical contact and a second electrical contact, said first electrical contact bonded over a first portion of said graphene layer and said second electrical contact bonded over a second portion of said graphene layer;
wherein said graphene layer electrically coupled between said first electrical contact and said second electrical contact, said graphene layer is configured to receive a DC bias voltage between said first electrical contact and said second electrical contact; and
an apexed photoelectric element bonded to said graphene layer, said apexed photoelectric element configured to supply a pulsed burst of electrons to said graphene layer in response to light shining upon said apexed photoelectric element.

7. The emitter according to claim 6, wherein said graphene layer radiates radio frequency energy in response to said pulsed burst of photoelectrons.

8. The emitter according to claim 6, wherein said graphene layer comprises a semicircular portion.

9. The emitter according to claim 6, wherein said graphene layer comprises a semicircular portion, and wherein said graphene layer is configured to be adjusted to radiate radio frequency energy over a range of about 300 gigahertz to about 3 terahertz, the frequency depending upon the field strength of an externally applied magnetic field applied to said graphene layer.

10. The emitter according to claim 6, wherein said graphene layer comprises a portion of a substantially planar annulus having a first radius and a second radius, said first radius and said second radius together defining a width of said annulus.

11. An emitter, comprising:
a substrate;
an insulator bonded to said substrate;
a graphene layer bonded to said insulator;
a first electrical contact and a second electrical contact, said first electrical contact bonded over a first portion of said graphene layer and said second electrical contact bonded over a second portion of said graphene layer;
wherein said graphene layer electrically coupled between said first electrical contact and said second electrical contact, said graphene layer is configured to receive a DC bias voltage between said first electrical contact and said second electrical contact; and
a plurality of apexed photoelectric elements bonded to said graphene layer, said plurality of apexed photoelectric elements configured to supply a pulsed burst of electrons to said graphene layer in response to light shining upon said plurality of apexed photoelectric elements.

12. The emitter according to claim 11, wherein said graphene layer radiates radio frequency energy in response to said pulsed burst of photoelectrons.

13. The emitter according to claim 11, wherein said graphene layer comprises a semicircular portion.

14. The emitter according to claim 11, wherein said graphene layer comprises a semicircular portion, and wherein said graphene layer is configured to be adjusted to radiate radio frequency energy over a range of about 300 gigahertz to about 3 terahertz, the frequency depending upon the field strength of an externally applied magnetic field applied to said graphene layer.

15. The emitter according to claim 11, wherein said graphene layer comprises a portion of a substantially planar annulus having a first radius and a second radius, said first radius and said second radius together defining a width of said annulus.

* * * * *